(12) United States Patent
Ahmed et al.

(10) Patent No.: US 9,401,443 B2
(45) Date of Patent: *Jul. 26, 2016

(54) ELECTRODEPOSITION METHODS OF GALLIUM AND GALLIUM ALLOY FILMS AND RELATED PHOTOVOLTAIC STRUCTURES

(75) Inventors: Shafaat Ahmed, Yorktown Heights, NY (US); Hariklia Deligianni, Yorktown Heights, NY (US); Qiang Huang, Yorktown Heights, NY (US); Kathleen B. Reuter, Yorktown Heights, NY (US); Lubomyr T. Romankiw, Yorktown Heights, NY (US); Raman Vaidyanathan, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 833 days.

This patent is subject to a terminal disclaimer.

(21) Appl. No.: 13/604,054

(22) Filed: Sep. 5, 2012

(65) Prior Publication Data

US 2013/0008798 A1    Jan. 10, 2013

Related U.S. Application Data

(63) Continuation of application No. 12/874,496, filed on Sep. 2, 2010, now abandoned.

(51) Int. Cl.
*C25D 3/38* (2006.01)
*C25D 3/54* (2006.01)
(Continued)

(52) U.S. Cl.
CPC ............. *H01L 31/0322* (2013.01); *C25D 3/38* (2013.01); *C25D 3/54* (2013.01); *C25D 3/58* (2013.01);
(Continued)

(58) Field of Classification Search
CPC ............ H01L 31/0272; H01L 31/0323; H01L 31/033046
USPC .................................. 205/238, 239
See application file for complete search history.

(56) References Cited

U.S. PATENT DOCUMENTS 2,582,377 A    1/1952 Brown
2,793,179 A    5/1957 De La Breteque
(Continued)

FOREIGN PATENT DOCUMENTS

CN    1742370 A    3/2006
CN    101228639 A    7/2008
(Continued)

OTHER PUBLICATIONS

Yang, "Electrodeposition of GaAs From Aqueous Solutions", Aug. 1990, p. 1-127.*

(Continued)

*Primary Examiner* — Nicholas A Smith
*Assistant Examiner* — Brian W Cohen
(74) *Attorney, Agent, or Firm* — Cantor Colburn LLP; Vazken Alexanian

(57) ABSTRACT

Photovoltaic devices and methods for preparing a p-type semiconductor generally include electroplating a layer of gallium or a gallium alloy onto a conductive layer by contacting the conductive layer with a plating bath free of complexing agents including a gallium salt, methane sulfonic acid or sodium sulfate and an organic additive comprising at least one nitrogen atom and/or at least one sulfur atom, and a solvent; adjusting a pH of the solution to be less than 2.6 or greater than 12.6. The photovoltaic device includes an impurity in the p-type semiconductor layer selected from the group consisting of arsenic, antimony, bismuth, and mixtures thereof. Various photovoltaic precursor layers for forming CIS, CGS and CIGS p-type semiconductor structures can be formed by electroplating the gallium or gallium alloys in this manner. Also disclosed are processes for forming a thermal interface of gallium or a gallium alloy.

6 Claims, 6 Drawing Sheets

(51) Int. Cl.

| | |
|---|---|
| *C25D 3/56* | (2006.01) |
| *C25D 3/58* | (2006.01) |
| *C25D 7/12* | (2006.01) |
| *C25D 5/10* | (2006.01) |
| *H01L 31/032* | (2006.01) |
| *C25D 5/56* | (2006.01) |
| *H01L 21/02* | (2006.01) |
| *H01L 31/0749* | (2012.01) |
| *H01L 23/373* | (2006.01) |

(52) U.S. Cl.
CPC .. *C25D 5/10* (2013.01); *C25D 5/56* (2013.01); *C25D 7/126* (2013.01); *H01L 21/02568* (2013.01); *H01L 21/02628* (2013.01); *H01L 31/0749* (2013.01); *H01L 23/3738* (2013.01); *H01L 2224/73253* (2013.01); *Y02E 10/541* (2013.01)

(56) References Cited

U.S. PATENT DOCUMENTS

| | | | |
|---|---|---|---|
| 3,677,918 | A | 7/1972 | Miyake |
| 3,904,497 | A | 9/1975 | Sleppy et al. |
| 5,125,984 | A | 6/1992 | Kruehler et al. |
| 5,744,849 | A | 4/1998 | Sugawa |
| 5,871,630 | A | 2/1999 | Bhattacharya et al. |
| 5,985,691 | A * | 11/1999 | Basol ............... H01L 31/0322 257/E31.007 |
| 6,528,794 | B1 | 3/2003 | Sato |
| 7,297,868 | B2 | 11/2007 | Bhattacharya |
| 7,405,098 | B2 | 7/2008 | Lee et al. |
| 7,498,243 | B2 | 3/2009 | Liu et al. |
| 7,507,321 | B2 | 3/2009 | Aksu et al. |
| 7,515,793 | B2 | 4/2009 | Dehlinger et al. |
| 7,875,522 | B2 | 1/2011 | Kapur et al. |
| 8,304,272 | B2 | 11/2012 | Assefa et al. |
| 2003/0150743 | A1 | 8/2003 | Obata et al. |
| 2005/0173255 | A1 | 8/2005 | Bokisa et al. |
| 2005/0189231 | A1 | 9/2005 | Capper et al. |
| 2005/0202589 | A1* | 9/2005 | Basol ........................ 438/102 |
| 2006/0057766 | A1 | 3/2006 | Xia et al. |
| 2006/0121701 | A1 | 6/2006 | Basol |
| 2006/0151331 | A1 | 7/2006 | Taunier et al. |
| 2006/0194418 | A1 | 8/2006 | Lee et al. |
| 2007/0004067 | A1 | 1/2007 | Hsu et al. |
| 2007/0018270 | A1 | 1/2007 | Leon et al. |
| 2007/0054435 | A1 | 3/2007 | Yoon |
| 2007/0093006 | A1* | 4/2007 | Basol ........................ 438/150 |
| 2007/0166964 | A1 | 7/2007 | Basol |
| 2007/0262296 | A1 | 11/2007 | Bauer |
| 2007/0272558 | A1 | 11/2007 | Aksu et al. |
| 2008/0023336 | A1* | 1/2008 | Basol ........................ 205/182 |
| 2008/0093221 | A1 | 4/2008 | Basol |
| 2008/0230395 | A1 | 9/2008 | Inbe et al. |
| 2008/0268138 | A1 | 10/2008 | Reddington et al. |
| 2009/0075102 | A1 | 3/2009 | Brese et al. |
| 2009/0108384 | A1 | 4/2009 | Assefa et al. |
| 2009/0188808 | A1 | 7/2009 | Wong et al. |
| 2009/0283415 | A1 | 11/2009 | Aksu et al. |
| 2010/0059385 | A1 | 3/2010 | Li |
| 2010/0139758 | A1 | 6/2010 | Chang et al. |
| 2010/0140098 | A1 | 6/2010 | Uzoh |
| 2010/0200050 | A1 | 8/2010 | Aksu et al. |
| 2010/0213073 | A1 | 8/2010 | Huang et al. |
| 2011/0108115 | A1 | 5/2011 | Deligianni et al. |
| 2012/0055801 | A1 | 3/2012 | Ahmed et al. |
| 2012/0061247 | A1 | 3/2012 | Ahmed et al. |
| 2012/0061250 | A1 | 3/2012 | Ahmed et al. |
| 2012/0288992 | A1 | 11/2012 | Assefa et al. |
| 2012/0325668 | A1 | 12/2012 | Ahmed et al. |
| 2014/0134789 | A1 | 5/2014 | Assefa et al. |
| 2014/0134790 | A1 | 5/2014 | Assefa et al. |

FOREIGN PATENT DOCUMENTS

| | | |
|---|---|---|
| CN | 101506991 A | 8/2009 |
| CN | 101805915 A | 8/2010 |
| EP | 2128903 A1 | 12/2009 |
| EP | 2180770 A1 | 4/2010 |
| JP | 2008330613 A | 12/1996 |
| JP | 200931683 A | 2/1997 |
| JP | 2009148602 A | 6/1997 |
| JP | 2000501232 A | 2/2000 |
| JP | 2009538012 A | 8/2009 |
| KR | 2008068334 A | 7/2008 |
| WO | WO2009052479 A2 | 4/2009 |
| WO | 2009144036 A1 | 12/2009 |

OTHER PUBLICATIONS

Assefa, et al., "CMOS-Integrated 40GHz Germanium Waveguide Photodetector for On-Chip Optical Interconnects," 2009 Conference on Optical Fiber Communication, copyright 2009 IEEE, pp. 1-3.

Assefa, et al., "Reinventing Germanium Avalanche Photodetector for Nanophotonic On-Chip Optical Interconnects," Copyright 2010, Macmillan Publisher Limited, vol. 464, No. 4, Mar. 4, 2010, Nature, pp. 80-85.

Toko, K. et al., "Defect-Free single-crystal Ge island arrays on insulator by rapid-melting-growth combined with seed-positioning technique," Applied Physics Letters 95, 112107; Sep. 18, 2009, pp. 1-3.

Final Office Action issued in U.S. Appl. No. 13/556,597 dated Apr. 25, 2013; 8 pages.

Final Office Action issued in U.S. Appl. No. 13/604,060 dated May 1, 2013; 23 pages.

Final Office Action issued in U.S. Appl. No. 12/874,496 dated Apr. 26, 2013; 13 pages.

Notice of Allowance issued in U.S. Appl. No. 12/874,504 dated May 22, 2013; 12 pages.

Wijesundera, R.P., "Preparation of CuInS2 thin films by electrodeposition and sulphurisation for applications in solar cells," Solar Energy Materials & Solar Cells, Feb. 2004, vol. 81 (2004), pp. 147-154.

Amendment to Final Office Action Filed in U.S. Appl. No. 13/556,597, dated Jun. 19, 2013; 7 pages.

Gao et al., "Electrosynthesis and Characterization of GaAs Polycrystalline Thin Films", J. Appl. Phys. (Jan. 1, 1994), vol. 75, No. 1, pp. 549-552.

Mahalingam et al., "Electrosynthesis and Characterization of GaAs in Acid Solutions by Potentiostatic Method", Solar Energy Materials & Solar Cells (no month, 2006), vol. 90, pp. 24562463.

Non Final Office Action issued in U.S. Appl. No. 13/604,060 dated Aug. 5, 2013; 21 pages.

Andreoli, P., et al. "Electrochemical approaches to GaAs1-xSbx thin films" Journal of Electroanalytical Chemistry 385 (1995), (c) 1995 Elsevier Science S.A., pp. 265-268.

Bockris, J. O'M. et al. "Electrodeposition of Gallium on Liquid and Solid Gallium Electrodes in Alkaline Solutions", Supplied by The British Library—Journal of the Electrochemical Society, Jan. 1962, pp. 48-58.

Chen, W.S., et al "Development of thin film polycrystalline CuIn1-xGaxSe2 solar cells," 19th IEEE Photovoltaic Specialists Conference, New Orleans, LA, May 4-8, 1987, Proceedings (A88-34226 13-44), 1987, pp. 1445-1447.

Flamini, D.O., et al. "Electrodeposition of gallium onto vitreous carbon" Received May 24, 2006, Accepted Nov. 6, 2006, published online: Jan. 5, 2007; J. Appl. Electrochem (2007); 37, pp. 467-471.

Sundararajan, S. et al. "The Electrodeposition of Gallium from a Chloride Bath", Journal of the Less-Common Metals, II, Received May 28, 1966, pp. 360-364.

International Search Report and Written Opinion issued in International Application No. PCT/EP2011/063558 dated Jan. 3, 2012; 17 pages.

International Search Reporrt and Written Opinion issued in International Application No. PCT/EP2011/063558 dated Jan. 3, 2012, 17 pages.

(56) References Cited

OTHER PUBLICATIONS

K. Toko et al., "Defect-Free single-crystal Ge island arrays on insulator by rapid-melting-growth combined with seed-positioning technique," Applied Physics Letters 95, 112107; Sep. 18, 2009, pp. 1-3.

M. Miyao et al., "High-quality single-cyrstal Ge stripes on quartz substrate by rapid-melting-growth," Applied Physics Letters 95, 022115; Jul. 17, 2009, pp. 1-3.

Notice of Allowance for U.S. Appl. No. 13/024,724, filed Feb. 10, 2011; First Named Inventor: Solomon Assefa; Mailing Date: Jun. 26, 2012.

International Search Report; International Application No. PCT/EP2011/060377; International Filing Date: Jun. 21, 2011; Date of Mailing: Jan. 6, 2012.

International Search Report—Written Opinion; International Application No. PCT/EP2011/060377; International Filing Date: Jun. 21, 2011; Date of Mailing: Jan. 6, 2011.

Invitation to Pay Additional Fees and Where Applicable, Protest Fee, issued in International Application No. PCT/EP2011/063561, dated May 18, 2012; 6 pages.

S. Assefa, et al., "CMOS-Integrated 40GHz Germanium Waveguide Photodetector for On-Chip Optical Interconnects," 2009 Conference on Optical Fiber Communication, copyright 2009 IEEE, pp. 1-3.

S. Assefa, et al., "CMOS-Integrated Optical Receivers for On-Chip Interconnects," IEEE Journal of Selected Topics in Quantum Electronics, vol. 16, No. 5, Sep./Oct. 2010, pp. 1376-1385.

S. Assefa, et al., "Reinventing Germanium Avalanche Photodetector for Nanophotonic On-Chip Optical Interconnects," Copyright 2010, Macmillan Publisher Limited, vol. 464, No. 4, Mar. 4, 2010, Nature, pp. 80-85.

S. Assefa, et al., "CMOS-Integrated High-Speed MSM Germanium Waveguide Photodetector," Optics Express, Mar. 1, 2010, vol. 18, No. 5, Copyright 2010 OSA, pp. 1-14.

S. Wolf, et al., "Ion Implantation for VLSI," Silicon Processinf for the VLSI Era, vol. 1, Lattice Press, Copyright 1986, pp. 280-330.

V. A. Vu, et al., "PIN Germanium Photodetector Fabrication Issues and Manufacturability," IEEE Transactions on Semiconductor Manufacturing, vol. 23, No. 3, Aug. 2010, pp. 411-418.

Yang, Ming-Chang. "Electrodeposition of GaAs from Aqueous Solutions", Supplied Universiy of Microfilms International, Aug. 1990, 146 pgs.

Notification of Transmittal of the International Search Report and the Written Opinion of the International Searching Authority, or the Declaration, issued in International Application No. PCT/EP2011/063561 on Aug. 1, 2012; 16 pages.

B-H. Tseng, et al., "Influence of Sb on the Growth and Properties of CuInSe2 Thin Films", Japanese Journal of Applied Physics 34, p. 1109-1112 (1995).

M. Yuan, et al., "Optimization of CIGS-based PV Device Through Antimony Doping", Chemistry of Materials 22, p. 285-287 (2010).

Non-Final Office Action issued in U.S. Appl. No. 12/874,496, dated Sep. 3, 2013; 17 pages.

Y. Akaki, et al., "Structural, Electrical and Optical Properties of Bi-doped CuInS2 Thin Films Grown by Vacuum Evaporation Method", Physica Status Solidi (C) 8, p. 2597-2600 (2006).

Y. Oda, Electrodeposited CuGa(Se,Te) 2 Thin-Film Prepared from Sulfate Bath, Physica Status Solidi (C) 8, p. 2581-2584 (2006).

Altosaar, et al., Electrochemical deposition of compound simiconductor thin films, Proceedings of the Symposium on Photoelectrochemistry, vol. 97-20, Pennington, NJ, USA., pp. 11-15; 1997.

Birkmire, et al., "Cu(InGa) Se2 Solar Cells on a Flexible Polymer Web," Progress in Photovoltaics: Research and Applications, vol. 13, pp. 141-148: 2005.

Kampmann, et al., "Electrodeposition of CIGS on Metal Substrates," Material Resarch Society Symposia Proceedings, vol. 763, Warrendale, PA, USA., pp. 323-328; 2003.

Rechid, et al., "9% Efficiency: Cigs on Cu Substrate," Proceedings of the 3rd World Conferenceon Photovoltaic Energy Conversion, vol. 1, May 11-18, Osaka, Japan, pp. 559-561.

Subramanian, G.K.R., "High Speed Gold Electroforming Bath for Dental Applications," Application No. 1186/CHE/2005 filed on Aug. 26, 2005, Published on Jul. 27, 2007 (English Abstract).

Amendment to Office Action Filed in U.S. Appl. No. 12/874,504 dated Dec. 19, 2012; 10 pages.

Amendment to Office Action Filed in U.S. Appl. No. 12/874,504, dated Mar. 18, 2013; 6 pages.

Final Office Action issued in U.S. Appl. No. 12/874,504 dated Jan. 28, 2013; 17 pages.

Office Action issued in U.S. Appl. No. 13/604,060, dated Jan. 9, 2013; 181 pages.

Non Final Office Action issued in U.S. Appl. No. 12/874,504 issued Sep. 27, 2012; 182 pages.

Amendment to Office Action Filed in U.S. Appl. No. 13/604,060 dated Apr. 9, 2013; 13 pages.

Final Office Action issued in U.S. Appl. No. 13/604,060 dated Nov. 13, 2013; 9 pages.

\* cited by examiner

Substrate: Glass / 600 nm Mo / 240 nm Cu / 360 nm In / 150 nm Ga

ELECTRODEPOSITION METHODS OF GALLIUM AND GALLIUM ALLOY FILMS AND RELATED PHOTOVOLTAIC STRUCTURES

CROSS REFERENCE TO RELATED APPLICATIONS

The present application is a continuation of and claims priority to U.S. patent application Ser. No. 12/874,496, filed Sep. 2, 2010, the contents of which are incorporated by reference in its entirety.

BACKGROUND

This invention generally relates to electro deposition processes of gallium and gallium alloy films for fabrication of thin film photovoltaic devices such as those containing copper, indium, gallium, and/or selenium and as thermal interface materials.

For photovoltaic applications, two layers of semiconductor material having different characteristics are generally used in order to create an electrical field and a resultant electrical current. The first layer is typically an n-type semiconductor material and is generally thin so as to let light pass through to an underlying p-type semiconductor layer material layer, which is often referred to as the absorbing layer. The absorbing layer in combination with the n-type semiconductor material layer provides a suitable band gap to absorb photons from the light source and generate a high current and an improved voltage. For the p-type layer, thin films of a copper-indium-gallium-diselenide semiconductor material (i.e., $CuInGaSe_2$ and variations thereof, also referred to as CIGS) or copper indium diselenide (i.e., $CuInSe_2$, also referred to as CIS) or copper gallium diselenide (i.e., $CuGaSe_2$, also referred to as CGS) have generated significant interest over the years for their use in photovoltaic devices.

By way of example, the p-type CIGS layer is typically combined with an n-type CdS layer to form a p-n heterojunction CdS/CIGS device. Zinc oxide and doped zinc oxide may be added to improve transparency. The direct energy gap of CIGS results in a large optical absorption coefficient, which in turn permits the use of thin layers on the order of 1-2 μm. By way of example, it has been reported that the absorbed layer band gap was increased from 1.02 electron-volts (eV) for a $CuInSe_2$ (CIS) semiconductor material to 1.1-1.2 eV by partial substitution of the indium with gallium, leading to a substantial increase in efficiency.

Formation of the CIGS structure is typically by vacuum deposition, chemical deposition or electrodeposition. The most common vacuum-based process co-evaporates or co-sputters copper, gallium, and indium, then anneals the resulting film with a selenium or sulfur containing vapor to form the final CIGS structure. An alternative is to directly co-evaporate copper, gallium, indium and selenium onto a heated substrate. A non-vacuum-based alternative process deposits nanoparticles of the precursor materials on the substrate and then sinters them in situ. Electrodeposition is another low cost alternative to apply the CIGS layer. Although electrodeposition is an attractive option for formation of gallium thin films, especially for photovoltaic applications such as CIGS, current processes are generally not commercially practical. Gallium is generally considered a difficult metal to deposit without excessive hydrogen generation on the cathode because the gallium equilibrium potential is relatively high. Hydrogen generation on the cathode causes the deposition efficiency to be less than 100% because some of the deposition current gets used to form hydrogen gas rather than to form the gallium film on the substrate or cathode. Low cathodic deposition efficiency due to excessive hydrogen generation results in poor process repeatability, partly due to the poor cathodic efficiency, and most importantly to poor deposit film quality with high surface roughness and poor deposit morphology.

Accordingly, there is a need in the art for improved electrodeposition processes for depositing gallium and gallium alloys as well as novel photovoltaic devices containing the same with increased band gap to provide increased photovoltaic current.

SUMMARY

The present invention is generally directed to methods of forming a p-type semiconductor layer for a photovoltaic device. In one aspect, the method comprises electroplating a first layer onto a conductive surface of a substrate, wherein said first layer is selected from the group consisting of a copper layer and a copper-gallium layer; electroplating a second layer onto said first layer, wherein said second layer is selected from the group consisting of an indium layer, a gallium layer, an indium-gallium layer, a copper-indium diselenide layer, and a copper-gallium-diselenide layer; and optionally electroplating a third layer onto said second layer, wherein said third layer is selected from the group consisting of a gallium layer and an indium layer; and optionally electroplating a fourth layer onto said third layer, wherein said fourth is selected from the group consisting of selenium and sulfur; wherein said electroplating is carried out by a method comprising: contacting: (i) a substrate and (ii) a solution comprising: a precursor comprising an element selected from the group consisting of copper, gallium, indium, selenium, sulfur and a combination thereof; optionally a metalloid compound additive; further optionally an organic additive having at least a sulfur atom; and a solvent to dissolve said precursors; wherein the solution is free of complexing agents; adjusting a pH of said solution to a range selected from the group consisting of a pH of about zero to less than about 2.6 and a pH of about 12.6 to about 14, and applying a current to electroplate said substrate to produce said first, second, third or fourth layers; and annealing said first, said second and said third layers in the presence of a selenium source and/or sulfur source to form the p-type semiconductor layer.

In a method for forming a thermal interface, the method comprises electroplating a layer of gallium or a gallium alloy onto a heat emitting surface coupled to a microprocessor, wherein electroplating the gallium or gallium alloy comprises contacting the heat emitting surface with a plating bath free of complexing agents comprising a gallium salt and an optional organic additive comprising at least one sulfur atom, and a solvent; adjusting a pH of the plating bath to a range selected from the group of a pH of greater than about zero to less than 2.6 and a pH greater than about 12.6 to about 14, and applying a current to electroplate the heat emitting surface to produce a layer of the gallium or gallium alloy; and coupling a heat sink or a heat spreader to the layer of gallium or the gallium alloy to form the thermal interface A photovoltaic device comprises at least one layer comprising gallium or indium or alloys comprising gallium and indium, wherein the at least one layer is formed by electrodeposition; and an impurity in the at least one layer selected from the group consisting of arsenic, antimony, bismuth, selenium, sulfur and mixtures thereof.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention provides low cost electrodeposition processes for forming thin layers of gallium and/or gallium alloys such as may be desired for forming various photovoltaic devices (e.g., CIGS, CIS, CGS, and the like) and as a thermal interface.

The electrodeposition processes utilize electroplating solutions to deposit compositionally pure, uniform, substantially defect free, and smooth thin films with high plating efficiency and repeatability. The electroplating solutions are free of complexing agents and can be practiced at both high and low pH ranges. Thin films of alloys may also be electroplated. Examples of desirable gallium alloys generally depend on the intended application and can include, without limitation, binary, ternary or higher order alloys of silver, copper, indium, zinc, tin, lead, silver, bismuth, gold, selenium, sulfur, and the like. Optionally, the alloy can be formed by annealing a film stack including an electrodeposited gallium layer and one or more alloying element metal layers. In this manner, low cost fabrication of gallium or gallium alloy thin films is achieved wherein the gallium layer or the gallium alloy layer is of uniform thickness, excellent morphology, and substantially defect free.

Figure 1:
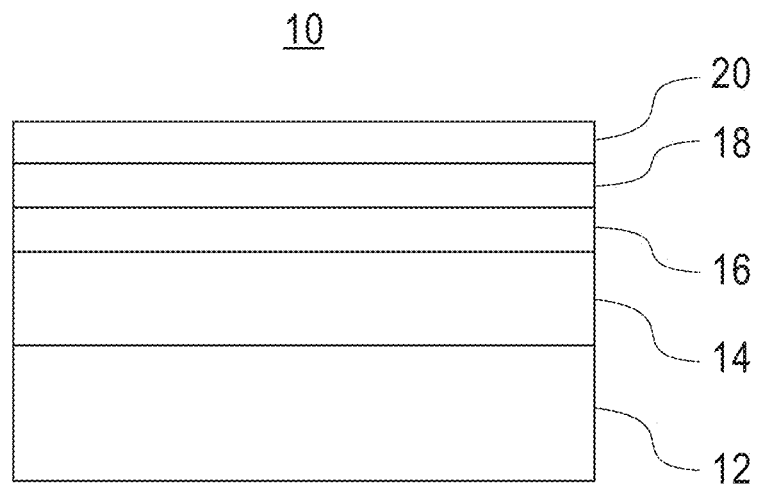
FIG. 1 depicts a cross sectional view of a CIGS precursor structure in accordance with the present invention.

In one embodiment, gallium is electrodeposited to form a CIGS precursor structure configured to control gallium inter-diffusion within the film stack. In the exemplary embodiment shown in FIG. 1, a conductive layer 14 is first deposited onto the substrate 12, which serves as a metal back contact. The conductive layer may include, without limitation, molybdenum, tantalum, tungsten, titanium, the corresponding nitrides thereof, and the like. The conductive layer is generally deposited by any means at a thickness of about 300 nm to about 600 nanometers (nm). A copper layer 16 is then disposed onto the conductive layer 14 at a thickness of about 10 nm to about 500 nm; in other embodiments, the copper layer is at a thickness of 220 nm to 260 nm; and in still other embodiments, the copper layer is at a thickness of about 240 nm. An indium layer 18 is then deposited onto the copper layer 16 at a thickness of 50 nm to 500 nm; in other embodiments, the indium layer is at a thickness of 375 nm to 425 nm; and in still other embodiments, the indium layer is at a thickness of about 420 nm. The gallium layer 20 is then deposited onto the indium layer 18 at a thickness of 20 nm to 200 nm; in other embodiments, the gallium layer is at a thickness of 100 nm to 150 nm; and in still other embodiments, the gallium layer is at a thickness of about 140 nm. The gallium layer is deposited using the electrodeposition process in accordance with the present disclosure. The other layers may be deposited by any deposition technique, e.g. vacuum deposition, but it is generally preferred that these layers be deposited by electrodeposition.

Figure 2:
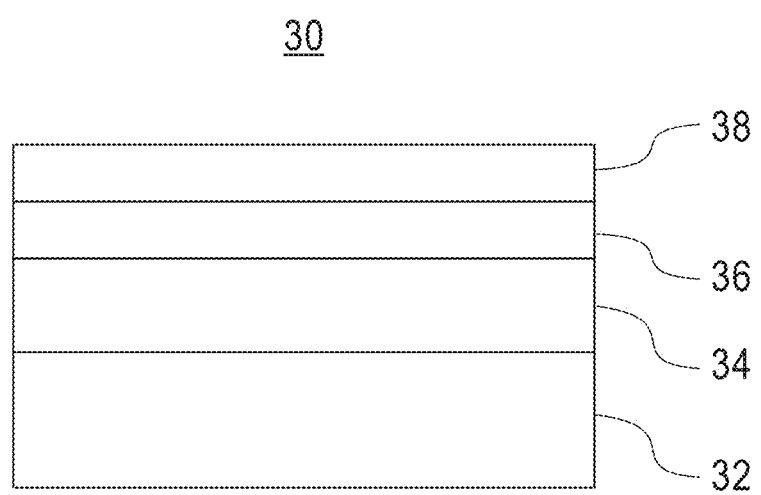
FIG. 2 depicts a cross sectional view of a CIGS precursor structure in accordance with the present invention.

FIG. 2 illustrates an exemplary film stack 30 suitable as a CIGS precursor structure in accordance with another embodiment of the present disclosure. In this exemplary embodiment, a conductive layer 34 is first deposited onto the substrate 32 at a thickness of about 300 nm to about 600 nm. A copper-gallium alloy layer 36 is then electrodeposited onto the conductive layer 34 at a thickness of 275 to 330 nm, e.g., 310 nm. An indium-gallium layer 38 is then electrodeposited onto the copper-gallium layer 36 at a thickness of 420 to 500 nm, e.g., 490 nm. The ratio of Cu/(In+Ga) can be maintained at 0.8 to 0.9 e.g., 0.88 and the ratio of Ga/(Ga+In) is can be maintained at 0.3 to 0.33, e.g., 0.31. It should be apparent in view of this disclosure that the conductive layer may be deposited by any deposition technique but it is generally preferred that these layers be deposited by electrodeposition. Gallium is a very low melting point element. It is liquid at about 35° C. and as a result is very mobile and inter-diffuses readily. Alloying gallium with higher melting point metals such as copper and indium not only reduces the number of electrodeposition process steps but also stabilizes the microstructure and allows better inter-mixing of the precursor CIGS material. This ultimately results in better compositional control of the CIGS p-absorber material.

Figure 3:
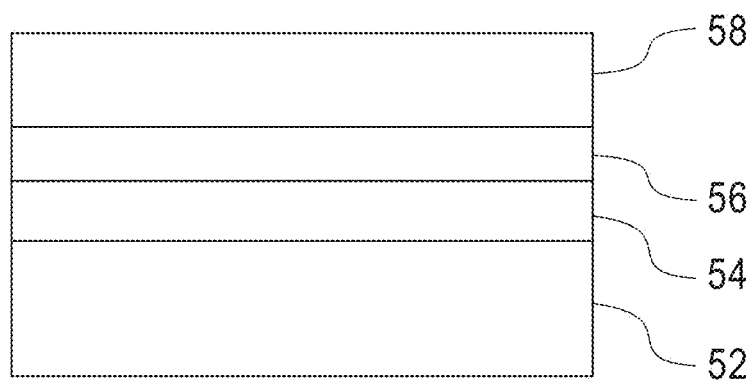
FIG. 3 depicts a cross sectional view of a CIGS precursor structure in accordance with the present invention.

FIG. 3 illustrates an exemplary film stack 50 suitable as a CIGS precursor structure in accordance with another embodiment of the present disclosure. In this exemplary embodiment, a conductive layer 54 is first deposited onto the substrate 54. A copper layer 56 is then disposed onto the molybdenum layer 56. The thicknesses of the copper and molybdenum layers are as previously described. An indium-gallium layer 58 is then electrodeposited onto the copper layer 56 at a thickness of 400 nm to 500 nm and most precisely 490 nm. The ratio of Cu/(In+Ga) can be maintained at 0.8 to 0.9, e.g., 0.88 and the ratio of Ga/(Ga+In) can be maintained at 0.3 to 0.33, e.g., 0.31. The conductive and copper layers may be deposited by any deposition technique but it is generally preferred that these layers be deposited by electrodeposition. Deposition of the InGa alloy provides better control of CIGS precursor intermixing and final control of the CIGS composition.

Figure 4:
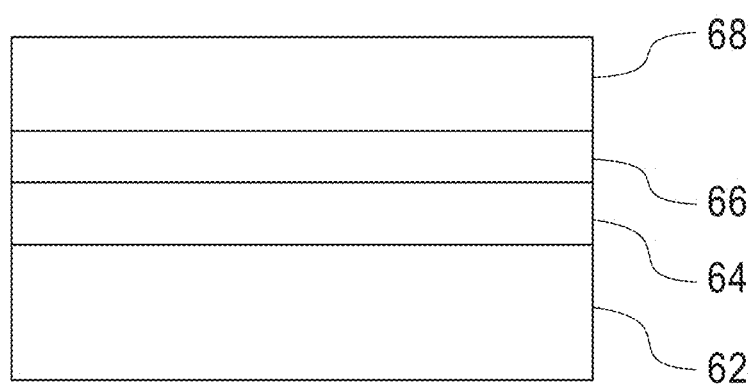
FIG. 4 depicts a cross sectional view of a CIGS precursor structure in accordance with the present invention.

FIG. 4 illustrates an exemplary film stack 60 suitable as a CIGS precursor structure in accordance with another embodiment of the present disclosure. In this exemplary embodiment, a conductive layer 64 is first deposited onto the substrate 62. A copper-indium-selenium layer 66 is then electrodeposited onto the molybdenum layer 64 at a thickness of 1 micron to 2.5 microns. A gallium alloy layer 68 is then electrodeposited onto the copper-selenium-indium layers 66. The thicknesses of the molybdenum and gallium layers are as previously described. It should be apparent in view of this disclosure that the conductive layer may be deposited by any deposition technique but it is generally preferred that these layers be deposited by electrodeposition. With this method, some of the indium in the CuInSe2 material is substituted by gallium forming $CuInGaSe_2$ upon annealing.

The films stacks including the copper, gallium, and indium layers as described above in relation to FIGS. 1-4 are then reacted with selenium and/or sulfur to form a $CuInGaSe_2$ or $CuInGaSe_2S$ or CuInGaS structure. For example, a selenium layer may be deposited onto the film stack and subsequently annealed to form the selenide. Alternatively, the film stack can be exposed to hydrogen selenide and/or hydrogen sulfide, for example, and subsequently annealed. Annealing in sulfur and/or selenium atmosphere may occur at a temperature of about 400° C. to about 700° C. and preferably 550° C. It should be apparent to those skilled in the art that subsequent to CIGS formation, deposition of an n-type junction layer (not shown) is then disposed onto the CIGS layer. As noted above, this layer will interact with the CIGS layer to form a p-n junction. The next layer to be deposited is typically a ZnO and doped ZnO transparent oxide layer (not shown). Moreover, it should be apparent that the electroplating process can be utilized to form precursor layers for other types of photovoltaic devices, e.g., copper-indium-selenium (CIS), copper-gallium-selenium (CGS), copper-indium-sulfur (CISu), copper gallium sulfur (CGSu) and the like.

In the various embodiments described above, the resulting CIGS structures generally have a Cu/(in+Ga) ratio of 0.8 to about 0.9 and a Ga/(Ga+In) ratio of 0.3 to about 0.33.

Figure 5:
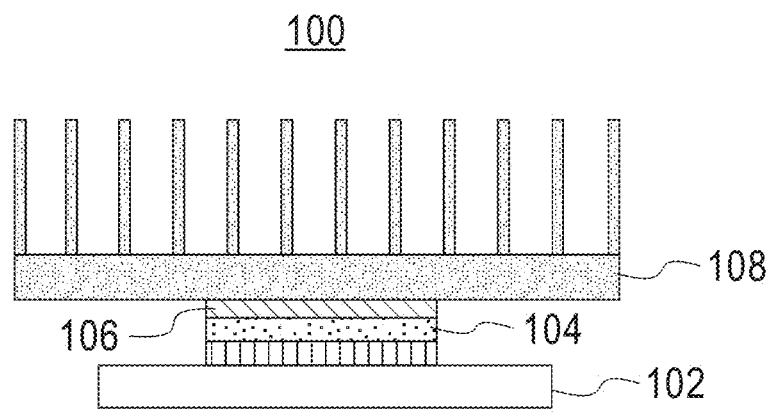
FIG. 5 depicts a cross sectional view of a gallium thermal interface.

In another embodiment, a gallium layer or a gallium alloy layer is electrodeposited to form a thermal interface. The layer of gallium or gallium alloy can be electroplated as a stack on the underlayer of Zn, Sn, In, Au, Cu, mixtures thereof, of the like. Gallium provides low tensile strength as well as high bulk thermal conductivity. As an alloy, self diffusion provides a low melting alloy suitable for its application as a thermal interface material. As such, gallium can be alloyed with other elements to lower the melting. FIG. 5 illustrates an exemplary device including a microprocessor chip coupled to a heat sink to prevent overheating by adsorbing its heat and dissipating the heat into the air. The device 100 includes a substrate 102 upon which the microprocessor 104 is formed and mounted. A gallium or gallium alloy layer 106 is electrodeposited onto a surface of the microprocessor. A heat sink 108 is then coupled to the gallium layer. Table 1 provides exemplary gallium alloys suitable for use as a thermal interface and the corresponding liquidus and solidus temperatures.

TABLE 1

| Composition | Liquidus (° C.) | Solidus (° C.) |
|---|---|---|
| 61.0Ga/0.25In/13.0Sn/1.0Zn | 7.6 | 6.5 |
| 62.5Ga/21.5In/16.0Sn | 10.7 | 10.7 |
| 75.5Ga/24.5In | 15.7 | 15.7 |
| 95Ga/5In | 25.0 | 15.7 |
| 100Ga | 29.8 | 29.8 |

The electrodeposition processes for forming the gallium or gallium alloy layers generally include electroplating a substrate surface (e.g., a working electrode) disposed in an aqueous plating bath comprising a gallium salt, a methane sulfonic acid (MSA) electrolyte, and a solvent. The pH of the bath can be controlled using an acid or a base. The concentration of gallium ions in the electrolyte may range from about 0.000005 Molar (M) M up to molar concentrations close to the saturation limit in the electrolyte and pH used. Useful gallium sources for the plating bath include gallium salts soluble within the plating bath including, without limitation, gallium chloride ($GaCl_3$), gallium bromide ($GaBr_3$), gallium iodide ($GaI_3$), gallium nitrate $Ga(NO_3)_3$, gallium sulfate $Ga(SO_4)_3$, mixtures thereof, and the like. Other suitable gallium salts include salts of sulfuric acid, sulfamic acid, alkane sulfonic acid, aromatic sulfonic acid, fluoroborate, and strong bases such as sodium hydroxide, potassium hydroxide, lithium hydroxide, calcium hydroxide, magnesium hydroxide, and the like.

The concentration of acid such as MSA as the electrolyte may range from about 0.1 M to about 2 M; in other embodiments, the acid is in a range of about 0.1 M to 1 M; and in still other embodiments, the acid is in a range of 0.5 M to 1 M. As described, the electrolyte bath is free from any kind of organic or inorganic complexing agents. That is, the gallium salt is soluble within the electrolyte bath.

The pH of the electrolyte bath is generally less than 2.6 or greater than 12.6. Applicants have discovered that the plating bath becomes cloudy, i.e., milky like in appearance, when the solution pH is in the range of $2.6 \leq pH \leq 12.6$. While not wanting to be bound by theory, it is believed that oxides and/or hydroxides of gallium are formed within this pH range, e.g. gallium oxides and hydroxides in aqueous solutions. Suitable acids or bases to provide and maintain the pH of the electrolyte bath are exclusive of complexing agents and may include, without limitation, mineral acids such as sulfuric acid, organic acids such as methane sulfonic acid, ethane sulfonic acid, propane sulfonic acid, butane sulfonic acid or other alkane sulfonic acid and aromatic sulfonic acid such as benzene sulfonic acid, and toluene sulfonic acid. Advantageously, it has been discovered that the electrodeposition processes at these pH ranges provide a uniform, thin conformal gallium layer, thereby preventing individual island formation.

The alloying elements may be added directly to the bath. For example, copper in the electrolyte may be provided by a copper source such as dissolved copper metal or a copper salt such as copper sulfate, copper chloride, copper acetate, copper nitrate, and the like. Likewise, indium may be provided in the electrolyte by an indium source such as indium chloride, indium sulfate, indium sulfamate, indium acetate, indium carbonate, indium sulfate, indium phosphate, indium oxide, indium perchlorate, indium hydroxide, and the like.

The gallium electroplating bath may further include an optional organic additive comprising at least one nitrogen atom or at least one sulfur atom. The organic additive is added to the plating bath to effectively increase hydrogen evolution over-potential and prevent or effectively limit the co-deposition/evolution of hydrogen during plating of gallium and to control microstructure of the deposit by controlling nucleation and growth. Advantageously, the additive also functions as a brightener and grain refiner while concomitantly assisting with gallium nucleation. Thinnest layers are formed by instantaneous nucleation where the same size islands form simultaneously on a surface. Also, thin layers can be formed by progressive nucleation where formation of islands is a function of time. In doing so, the resulting gallium layer is uniform and conformal, thereby preventing large three dimensional island formations during deposition. Exemplary organic additives include, without limitation, aliphatic and/or heterocyclic compounds such as thioureas, thiazines, sulfonic acids, sulfonic acids, allyl phenyl sulfone, sulfamides, imidazoles, amines, isonitriles, dithioxo-bishydroxylaminomolybdenum complex, and derivatives thereof.

The organic additive comprising the at least one nitrogen atom and/or at least one sulfur atom additive has been found to unexpectedly accelerate gallium plating while suppressing hydrogen evolution. In this manner, it has been discovered that the organic additive provides a synergistic effect when employed in combination with MSA as the electrolyte. The concentration of the organic additive comprising the at least one nitrogen atom and/or at least one sulfur atom may range from about 1 parts per million (ppm) to about 10000 ppm, in other embodiments, the organic additive is in a range of about 10 ppm to 5000 ppm, and in still other embodiments, the organic additive is in a range of 100 ppm to 1000 ppm.

In other embodiments, a metal oxide is added in combination with the organic additive to poison the cathode, thereby increasing the onset over-potential of hydrogen evolution (i.e., inhibit hydrogen generation) and accelerating gallium deposition. The inorganic metal oxide includes, without limitation, oxides of metalloids such as arsenic oxides (e.g., $As_2O_3$; $As_2O_5$, $KH_2AsO_4$, $K_2HAsO_4$, $K_3AsO_4$, $K_3AsO_3$, $KAsO_2$, $NaH_2AsO_4$, $Na_2HAsO_4$, $Na_3ASO_4$, $Na_3ASO_3$, $NaAsO_2$, $Na_4AS_2O_7$, and the like); antimony oxides, (e.g., $Sb_2O_3$, $Sb_2O_5$, $KH_2SbO_4$, $K_2HSbO_4$, $K_3SbO_4$, $K_3SbO_3$, $KSbO_2$, $NaH_2SbO_4$, $Na_2HSbO_4$, $Na_3SbO_4$, $Na_3SbO_3$, $NaSbO_2$, $Na_4Sb_2O_7$, and the like); and bismuth oxides (e.g., $Bi_2O_3$, $K_3BiO_3$, $KBiO_2$, $Na_3BiO_3$, $NaBiO_2$ and the like).

Gallium deposition and hydrogen evolution are known to occur simultaneously, and thus, prior art plating processes generally exhibit low plating efficiencies in order to prevent hydrogen evolution, which contributes to porosity within the deposited film structure The metal oxides described above are effective cathodic poisons and advantageously increase the onset of over-potential of hydrogen evolution and unexpectedly accelerate gallium deposition. Plating efficiencies greater than 90 to 95% have been observed with gallium plating solutions including the combination of the metal oxide and the organic additive comprising at least one nitrogen atom and at least one sulfur atom. The concentration of metal oxide in the electrolyte may range from about 1 parts per million (ppm) to about 10,000 ppm, in other embodiments, the metal oxide is in a range of about 100 ppm to 5,000 ppm, and in still other embodiments, the metal oxide is in a range of 1,000 ppm to 3,000 ppm. By introducing the metal oxide and/or sulfur in the plating bath, the resulting layer will include the corresponding metal (e.g., arsenic, antimony, bismuth or mixtures thereof), and/or sulfur as an impurity on the order of a few parts per million up to a few atomic percent in the deposit, which can be detected using an Auger or SIMS analytical method.

In another embodiment, the plating bath includes a gallium salt, a sodium sulfate ($Na_2SO_4$) electrolyte, an organic additive comprising the at least one nitrogen atom and/or at least one sulfur atom, and a solvent. The concentrations of the gallium salt and the organic additive are as previously described. The concentration of sodium sulfate as the electrolyte may range from about 0.01 M to about 2 M; in other embodiments, the sodium sulfate is in a range of about 0.1 M to 1 M; and in still other embodiments, the sodium sulfate is in a range of 0.2 M to 60 M. Optionally, the metal oxide as described above may be included in plating bath. The pH is less than 2.6 or greater than 12.6 as previously described.

In the various embodiments described above, the electroplating chemistry can be used on conductive and non-conductive substrates. Suitable conductive substrates include, without limitation, gold, molybdenum, indium copper, selenium, zinc, and the like. Suitable non-conductive substrates generally are those having a metal seed layer thereon and include, without limitation, glass, quartz, plastic, polymers, and the like. For example, the non-conductive substrate may include a seed layer, e.g., a copper seed layer. The particular method for depositing the seed layer is not limited and is well within the skill of those in the art. For example, the seed layer may be formed by chemical vapor deposition, plasma vapor deposition, or electroless deposition.

The electroplating baths may also comprise additional ingredients. These include, but are not limited to, grain refiners, surfactants, dopants, other metallic or non-metallic elements etc. For example, other types of organic additives such as surfactants, suppressors, levelers, accelerators and the like may be included in the formulation to refine its grain structure and surface roughness. Organic additives include but are not limited to polyalkylene glycol type polymers, polyalkane sulfonic acids, coumarin, saccharin, furfural, acryonitrile, magenta dye, glue, starch, dextrose, and the like.

Although water is the preferred solvent in the formulation of the plating baths, it should be appreciated that organic solvents may also be added in the formulation, partially or wholly replacing the water. Such organic solvents include but are not limited to alcohols, acetonitrile, propylene carbonate, formamide, dimethyl sulfoxide, glycerin, and the like.

Although DC voltage/current can be utilized during the electrodeposition processes, it should be noted that pulsed or other variable voltage/current sources may also be used to obtain high plating efficiencies and high quality deposits. The temperature of the electroplating baths may be in the range of 5 to 90° C. depending upon the nature of the solvent. The preferred bath temperature for water based formulations is in the range of 10 to 30° C.

Figure 6:
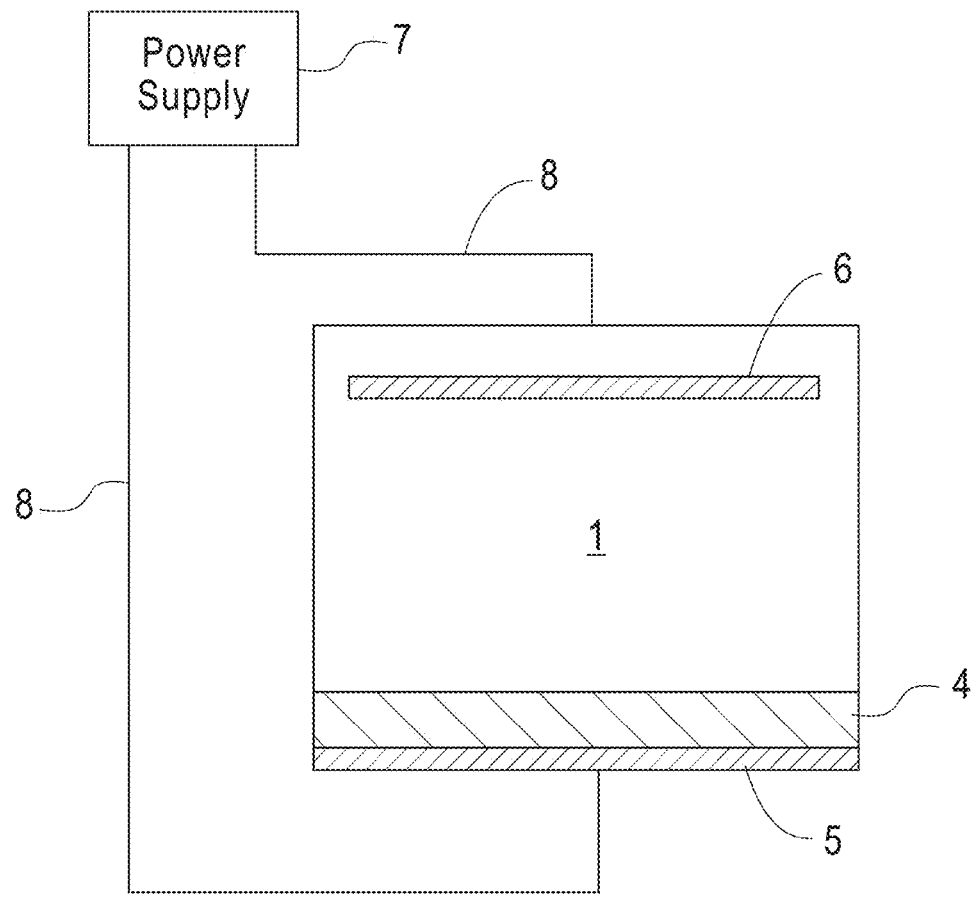
FIG. 6 schematically illustrates an exemplary electrodeposition apparatus for deposition of a gallium layer onto a substrate.

Referring now to FIG. 6, in practice, a backside electrical contact 5 is made to a conductive substrate 4, which functions as the working electrode, upon which gallium or gallium alloy is to be electrodeposited. Alternatively, if the substrate is non-conducting, a conductive layer and/or a seed layer (not shown) can first be deposited and electrical contact can be made directly to the seed layer via ohmic contact or to the underlying conductive layer. An electrolyte solution 1 in accordance with the present disclosure is placed in contact with the substrate surface 4. A conductive counter electrode 6, i.e., anode or conductor, is positioned in the electrolyte solution and spaced apart from the substrate (working electrode). While the substrate 4 is shown as having a planar surface, it is understood that substrate 4 can also have some topography and/or conformal conductive layers thereon. For electrochemical processing, an electrical current or voltage is applied to the substrate (electrode) 4 and the counter electrode 6 via a power supply 7 and electrical leads 8. If desired, the electrochemical potential of the structure/electrolyte can be controlled more accurately by the introduction of a third electrode, that is, a reference electrode (not shown), which has constant electrochemical potential. Examples of reference electrodes include a saturated calomel electrode (SCE) and silver-silver chloride (Ag/AgCl) reference electrodes or other metal reference electrodes such as Cu or Pt. The electrolyte solution can be agitated during electrodeposition.

The following examples are presented for illustrative purposes only, and are not intended to limit the scope of the invention.

Example 1

In this example, gallium was electroplated onto a film stack and subsequently self-annealed to form an indium rich indium-gallium alloy. The plating chemistry included 0.2M $Ga^{3+}$ in 0.5M MSA quenched with 0.5 M NaOH and then adjusted to a pH of 1.21 using additional amounts of MSA. Gallium was electroplated onto a 360 nm indium layer and a 250 nm copper layer. The gallium layer with a thickness of 150 nm was subsequently self-annealed at room temperature 18-22° C. for a period of 3 days. Upon plating gallium on indium, interdiffusion has onset immediately and progressively formed In—Ga eutectic alloy.

Figure 7:
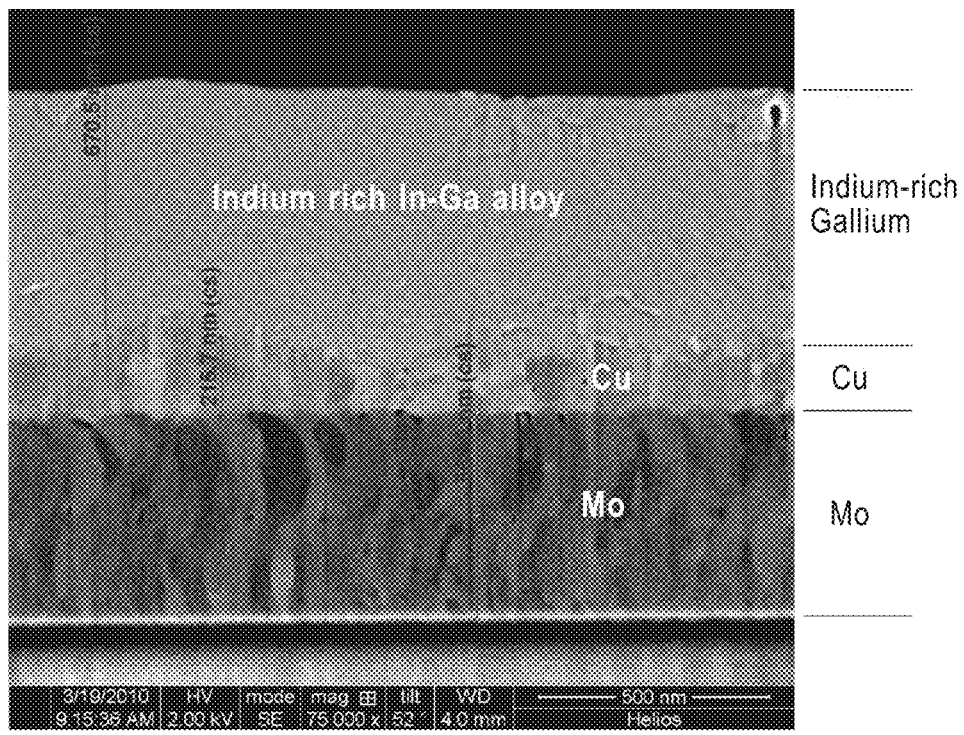
FIG. 7 shows a scanning electron micrograph of a cross-sectional view of a film stack wherein gallium was electrodeposited onto an indium layer and subsequently annealed to form an indium rich gallium eutectic layer.

FIG. 7 shows a scanning electron micrograph of a cross-sectional view of a film stack wherein gallium was electrodeposited onto the indium layer and subsequently annealed to form an indium-rich gallium eutectic layer. Interestingly, the Ga interdiffusion did not stop at the indium layer and continued into the copper forming an alloy of CuInGa.

Example 2

In this example, various gallium plating baths with and without the organic additive were used to electro deposit gallium onto glass substrates having thereon a molybdenum layer that had previously been seeded with copper. The plating solution included 0.25 M gallium sulfate in 0.5 M MSA with 0 and 500 ppm of thiourea. The electrolyte bath was at 18-20° C. and agitated at 0 and 550 rpm. The pH was maintained at 1.14 using $H_2SO_4$.

Figure 8:
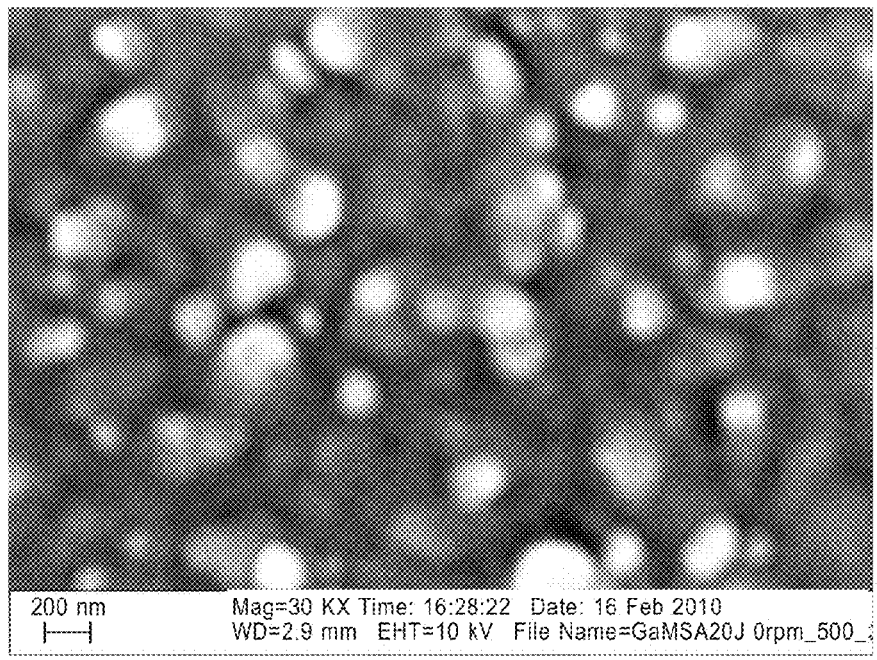
FIGS. 8 and 9 show scanning electron micrographs of top down views of gallium galvanostatically deposited from an acidic methane sulfonic acid solution with added thiourea at 20 and 30 mAcm$^{-2}$, respectively.
Figure 9:
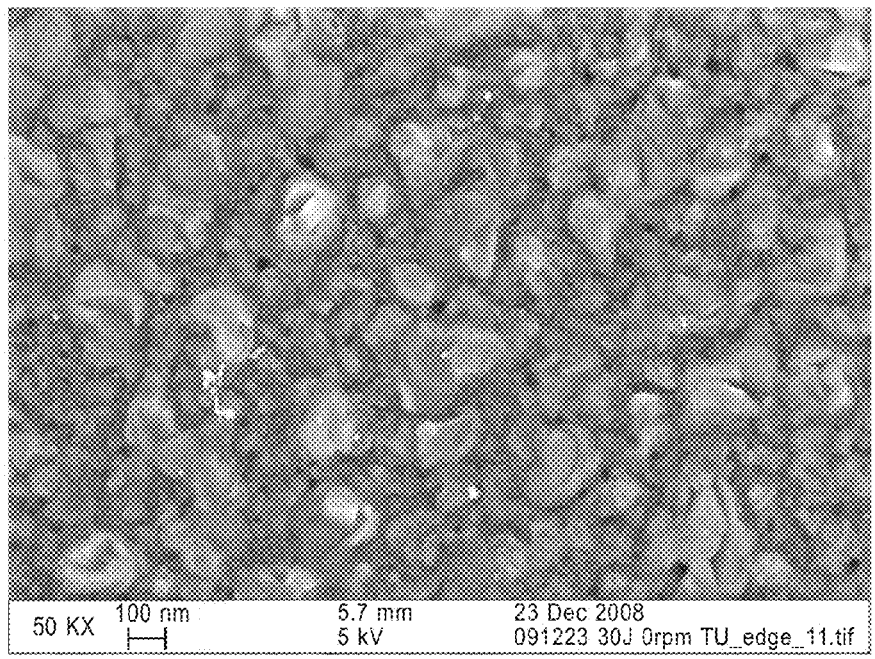

The results show that the presence of the organic additive clearly accelerated gallium plating relative to plating baths that did not contain the organic additive. Moreover, continuous agitation of the electrolyte provided significantly higher current densities than without. FIGS. 8 and 9 pictorially illustrate surface topographic views of the galvanostatically deposited gallium film at 20 mA/cm$^2$ and 30 mA/cm$^2$, respectively. An increase in grain size was observed with the increased current density. No porosity was observed and the films were uniform and of excellent morphology.

Example 3

In this example, the plating bath included 0.2M$Ga^{3+}$ in 0.5M MSA quenched with 0.5M NaOH and then adjusted by adding more MSA to obtain a pH of 1.18. Varying amounts of $As_2O_3$ were included in the plating bath, where indicated. For the plating bath that included no $As_2O_3$ or thiourea, the plating bath included $Ga^{3+}$ in 0.5 M MSA quenched with 0.5 M NaOH with the pH adjusted to 1.18 using additional MSA. The plating bath that included a combination of $As_2O_3$ and thiourea contained $As_2O_3$ was at 500-6000 ppm and the thiourea was at 100-1000 ppm.

Figure 10:
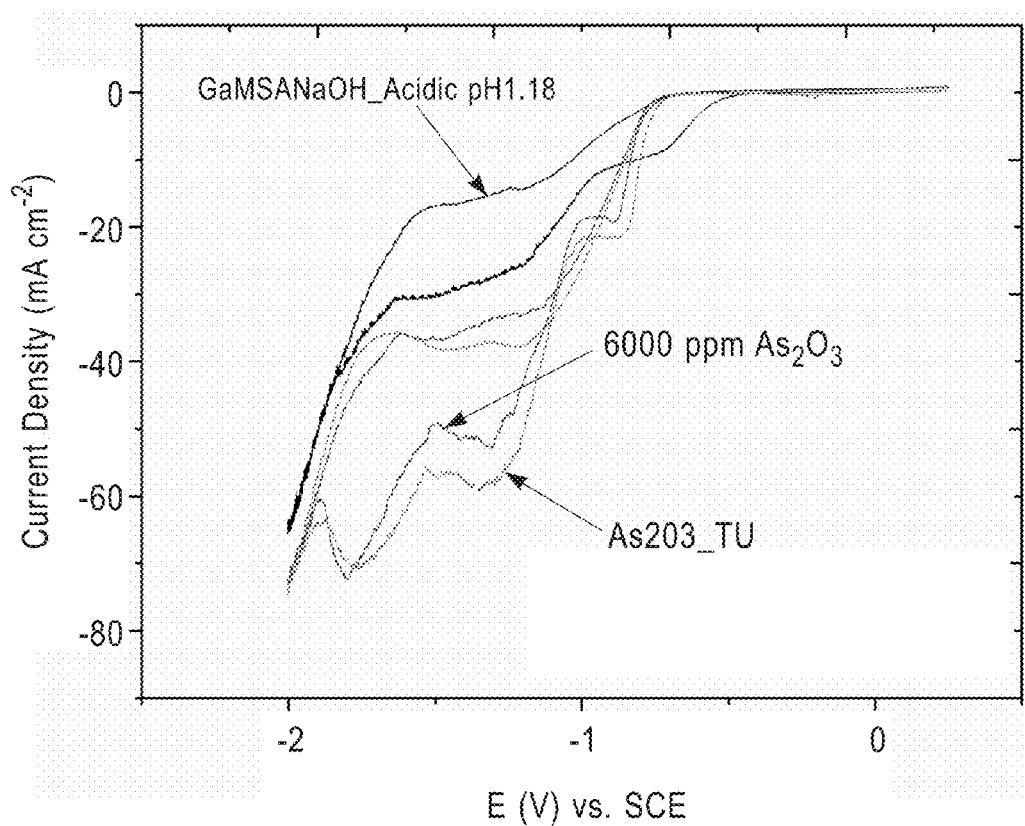
FIG. 10 graphically illustrates cyclic voltammetry plots for acidic gallium plating baths with no additives, with arsenic trioxide additive, and with arsenic trioxide and thiourea as additives.

FIG. 10 provides an overlay of the various voltammetry plots and includes data for the combination of $As_2O_3$ and thiourea. As shown, the increasing amounts of $As_2O_3$ provided a negative potential shift for onset of hydrogen evolution over-potential, thereby effectively inhibiting hydrogen generation. In addition, the combination of thiourea and $As_2O_3$ accelerated gallium deposition.

Example 4

In this example, the plating bath included 0.25M $Ga^{3+}$ in 0.5 M MSA quenched with 0.5 M NaOH and adjusted to a pH of 1.18 using additional amounts of MSA. Plating was carried out without any additional additives, with 6000 ppm $As_2O_3$, and with 6000 ppm $As_2O_3$ and 500 ppm thiourea. Cyclic voltammetry plots of these plating chemistries are provided in FIG. 10. Inhibition of hydrogen evolution and acceleration of gallium deposition was observed upon addition of $As_2O_3$ and further increases in acceleration with the combination of $As_2O_3$ and thiourea. It has also been shown that the combination of $As_2O_3$ and $As_2O_5$ is also effective for inhibiting the hydrogen evolution (results not shown here). When both of these oxides are combined together then the effect is much effective even at lower concentrations.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of forming a p-type semiconductor layer for a photovoltaic device, comprising:
    electroplating a first layer onto a conductive surface of a substrate, wherein said first layer is selected from the group consisting of a copper layer and a copper-gallium layer;
    electroplating a second layer onto said first layer, wherein said second layer is selected from the group consisting of an indium layer, a gallium layer, an indium-gallium layer, a copper-indium diselenide layer, and a copper-gallium-diselenide layer; and optionally
    electroplating a third layer onto said second layer, wherein said third layer is selected from the group consisting of a gallium layer and an indium layer, wherein at least one of the first, second and third layers is a gallium containing layer; and
    optionally electroplating a fourth layer onto said third layer, wherein said fourth is selected from the group consisting of selenium and sulfur; wherein said electroplating of the gallium containing layer is carried out by a method comprising: contacting: (i) a substrate and (ii) a solution comprising: a precursor comprising gallium or gallium and an element selected from the group consisting of copper, indium, selenium, sulfur and a combination thereof; an arsenic oxide metalloid compound additive; an alkane sulfonic acid selected from the group consisting of methane sulfonic acid, ethane sulfonic acid, propane sulfonic acid, and butane sulfonic acid wherein the alkane sulfonic acid is at a concentration of 0.1 M to 2 M, an organic additive having at least a sulfur atom; and a solvent to dissolve said precursors; wherein the solution is free of complexing agents; adjusting a pH of said solution to a range selected from the group consisting of a pH of greater than zero to less than about 2.6 and a pH of about 12.6 to about 14, and applying a current to electroplate said substrate to produce said first, second, third or fourth layers; and annealing said first, said second and said third layers in the presence of a selenium source and/or sulfur source to form the p-type semiconductor layer.

2. The method of claim 1, wherein the conductive surface is selected from the group consisting of molybdenum, tantalum, tungsten, titanium, and corresponding nitrides thereof.

3. The method of claim 1, wherein the solution comprises sodium sulfate at a concentration of 0.01 M to 2 M.

4. The method of claim 1, wherein the arsenic oxide metalloid compound additive is in an amount of 1 part per million to 10,000 parts per million.

5. The method of claim 1, wherein the organic additive is selected from the group consisting of thioureas, thiazines, sulfonic acids, allyl phenyl sulfone, sulfamides, dithioxo-bishydroxylaminomolybdenum complex, and derivatives thereof.

6. The method of claim 1, wherein the p-type semiconductor has a ratio of Cu/(In+Ga) at 0.8 to 0.9 and a ratio of Ga/(Ga+In) at 0.3 to 0.33.

* * * * *